(12) United States Patent
Toyomura et al.

(10) Patent No.: US 6,657,118 B2
(45) Date of Patent: Dec. 2, 2003

(54) SOLAR BATTERY MODULE, METHOD OF MANUFACTURING SAME AND POWER GENERATING APPARATUS

(75) Inventors: Fumitaka Toyomura, Nara (JP); Nobuyoshi Takehara, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/957,945

(22) Filed: Sep. 24, 2001

(65) Prior Publication Data

US 2002/0038666 A1 Apr. 4, 2002

(30) Foreign Application Priority Data

Sep. 29, 2000 (JP) ........................................ 2000-300164

(51) Int. Cl.[7] .......................... H01L 21/33; H01L 31/048
(52) U.S. Cl. ........................ 136/244; 136/251; 136/291; 136/293; 136/258; 363/60; 323/906; 323/221; 60/641.8
(58) Field of Search ................................ 136/244, 251, 136/291, 293, 258; 363/60, 147; 323/906, 221; 60/641.8

(56) References Cited

U.S. PATENT DOCUMENTS

| | | | | |
|---|---|---|---|---|
| 4,217,633 A | * | 8/1980 | Evans, Jr. ...................... | 363/27 |
| 4,499,658 A | * | 2/1985 | Lewis .......................... | 136/251 |
| 6,066,797 A | | 5/2000 | Toyomura et al. ........... | 136/251 |
| 2002/0038667 A1 | | 4/2002 | Kondo et al. ................. | 136/293 |
| 2002/0050290 A1 | * | 5/2002 | Kobayashi .................... | 136/293 |

FOREIGN PATENT DOCUMENTS

| | | |
|---|---|---|
| JP | 9-69647 | 3/1997 |
| JP | 11-251614 | 9/1999 |
| JP | 2000-77700 A | * 3/2000 |
| JP | 2001-156315 A | * 6/2001 |

OTHER PUBLICATIONS

Kurokawa et al, "Conceptual considerations on PV systems composed of AC modules," Solar Energy Materials and Solar Cells, vol. 47, (1997), pp. 243–250.*

"Solar Power Generation System Application Technology Development", 1996 Consigned Operation Result Report of New Energy and Industrial Technology Development Organization (NEDO), Japan Electrical Manufacturers' Association, Mar. 1997, pp. 104–105.

"Solar Power Generation System Application Technology Development", 1997 Consigned Operation Result Report of New Energy and Industrial Technology Development Organization (NEDO), Central Research Institute of Electric Power Industry, Mar. 1998, pp. 148–149.

* cited by examiner

*Primary Examiner*—Alan Diamond
(74) *Attorney, Agent, or Firm*—Fitzpatrick, Cella, Harper & Scinto

(57) ABSTRACT

If an inverter is merely attached to the back side of a solar battery module, the inverter becomes an obstacle to transport and installation, it may be broken if it strikes a building structure at the time of installation and it may malfunction owing to impact with an object. Accordingly, a weather-resistant film, a first filler, a solar battery element, a second filler and a back reinforcing material are stacked in the order mentioned and the fillers are melted using a vacuum laminator to thereby seal the solar battery element in resin between the back reinforcing material and weather-resistant film. At this time an inverter is placed on the surface of the back reinforcing material that opposes the solar battery element.

11 Claims, 6 Drawing Sheets

F I G. 4
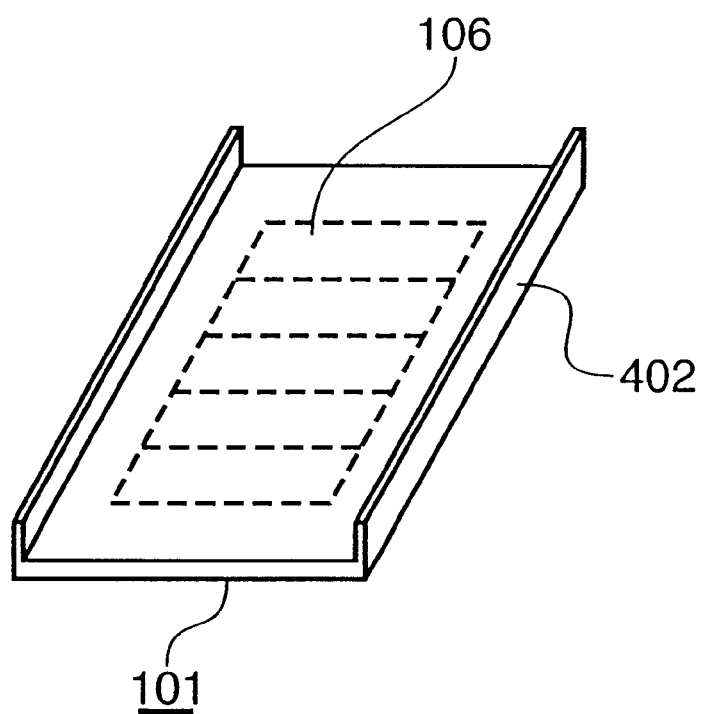

SOLAR BATTERY MODULE, METHOD OF MANUFACTURING SAME AND POWER GENERATING APPARATUS

FIELD OF THE INVENTION

This invention relates to a solar battery module and to a method of manufacturing the same. More particularly, the invention relates to a solar battery module having solar batteries and a power converter, a method of manufacturing the same and a power generating apparatus using this solar battery module.

BACKGROUND OF THE INVENTION

In an effort to tackle environmental problems, many types of solar power generating apparatus have been installed in recent years. Such an apparatus converts DC power, which has been generated by solar batteries, to AC power using an inverter, and supplies this AC power to a domestic load (hereinafter referred to simply as a "load" and/or a commercial power system (hereinafter referred to simply as a "system").

A solar power generating apparatus of this kind is noteworthy also as an emergency power supply for use at the time of disasters such as earthquakes. A type of solar power generating apparatus that has appeared recently is detached from the system and is allowed to run independently to supply power to a load in the event of a power outage caused by an earthquake, system malfunction or maintenance.

Furthermore, an AC module is noteworthy as a small- to medium-size solar power generating apparatus or emergency power supply. Such an AC module includes an inverter, which is referred to as an MIC (Module Integrated Converter), attached to the back side of a solar power generating apparatus and adapted to convert DC power generated by solar batteries to AC power. Such an AC module makes it possible for a single solar battery module to output AC power.

The inverter included in the AC module can be attached to the solar battery module by various methods, such as mounting it directly on the back side of the solar battery module, connecting it to a terminal box or securing it to a frame, as described in the specification of Japanese Patent Application Laid-Open No. 9-271179.

If the inverter is attached to the back side of the solar battery module, however, various problems arise. Specifically, the inverter becomes an obstacle to transport and installation, it may be broken if it strikes a building structure at the time of installation and it may malfunction owing to impact with an object.

SUMMARY OF THE INVENTION

The present invention has been devised in order to solve, individually or collectively, the problems of the prior art described above, and an object thereof is to prevent damage to and a decline in the reliability of a power converter when a solar battery module is transported and installed.

According to the present invention, the foregoing object is attained by providing a solar battery device comprising: a solar battery; a power converter arranted to convert power output from the solar battery, wherein the solar battery and the power converter are integrated; and a metal plate for mounting the integrated solar battery and the power converter; wherein the power converter is placed at a position intermediate the solar battery and the metal plate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a perspective view of a solar battery module that has been worked into the shape of a roofing tile;

DESCRIPTION OF THE PREFERRED EMBODIMENTS

Figure 1:
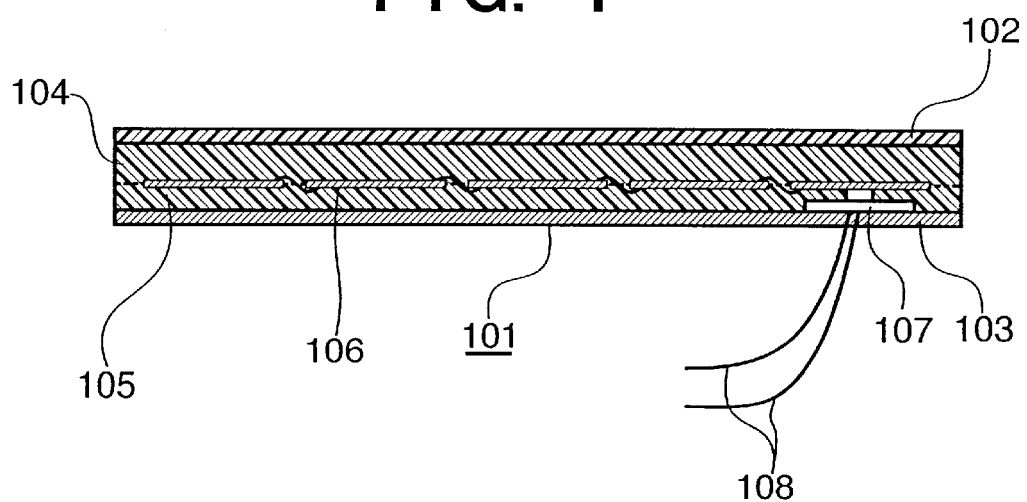
FIG. 1 is a diagram illustrating the structure of a solar battery module according to the present invention.

Preferred embodiments of a solar battery module according to the present invention will now be described in detail.

Solar Battery Module

Though there is no particular limitation upon the solar battery elements and solar battery module used in this embodiment, examples of solar batteries that can be used as silicon-semiconductor photovoltaic elements are monocrystalline silicon solar batteries, polycrystalline silicon solar batteries and amorphous silicon solar batteries, and examples of solar batteries that can be used as compound-semiconductor photovoltaic elements are III–V-family compound solar batteries, II–VI-family compound solar batteries and I–III–VI-family compound solar batteries.

If an amorphous silicon solar battery is used in this embodiment, an advantage gained is that a decline in power generating efficiency is suppressed by the annealing effect. Furthermore, since an amorphous silicon solar battery can be formed as a thin film on a film substrate or electrically conductive substrate, the solar battery itself can be made light in weight. Such a solar battery is effective when it is integrated with a building material.

The non-light-receiving side of a solar battery module often has a terminal box for extracting power or an output cable structure to which is attached an output cable having a waterproof connector at its distal end. By connecting terminal boxes using an output cable or by connecting waterproof connectors together, a plurality of solar battery modules can be connected to construct a solar array.

An inverter for converting DC power, which is output from the solar batteries, to AC power is placed between the solar battery elements and a back reinforcing material of the solar battery module according to this embodiment. An output cable is led from the inverter of the solar battery module to the non-light-receiving side or to the side face of the module. By connecting these output cables of a plurality of solar battery modules, a solar battery array is constructed and power can be supplied to a load and/or linked to a system.

In a case where a DC/DC converter is used instead of the inverter, a solar battery module and solar array can be constructed in a similar manner. In such case collected DC power is converted to AC power by an inverter and the power is supplied to the load and/or linked to the system.

Furthermore, the solar battery module according to this embodiment preferably employs a weather-resistant transparent film as a material for protecting the surface of the module, and a steel plate, such as is used for metal roofing, as the back reinforcing material. The surface of the steel plate preferably is coated with a polyester resin or fluoroplastic in order to provide weather resistance. A solar battery module having such a structure can be formed into building material such as roofing material or wall material. In particular, an amorphous silicon solar battery using an electrically conductive substrate has a high mechanical strength and flexibility. Such a solar battery exhibits a high degree of freedom in terms of shaping and working and lends itself to the shape of roofs and walls.

Further, in a case where air is warmed utilizing the space between a roof and sarking, as disclosed in the specification of Japanese Patent Application Laid-Open No. 10-54118, a solar battery module using a steel plate as the back reinforcing material is effective. In particular, if the solar battery module is one having the inverter on the back side thereof, then the heat evolved by the inverter can be utilized effectively.

Inverter

The inverter comprises a booster circuit for boosting the DC voltage, which is output from the solar battery module, up to the input voltage of an inverter circuit, the inverter circuit for converting the boosted DC power to AC power, and a control circuit for controlling inverter start/stop, optimum operation of the solar batteries and the operating mode, etc.

A booster chopping circuit, a voltage doubler circuit and a serial-parallel chopper circuit, etc., can be used as the booster circuit. It is preferred that the inverter circuit be of voltage type, in which an IGBT or MOSFET is used as the switching element. The requisite output power can be obtained by driving the gate of the switching element based upon a control signal from the control circuit. Further, the control circuit has, e.g., a CPU, a PWM waveform controller, a frequency/voltage reference generator, a current reference generator, a mode changeover unit and a switching controller.

Further, it may be so arranged that the control circuit can be operated externally via a communication line or communication path. An arrangement may be adopted in which the control circuit per se is placed outside the inverter so that a plurality of inverters can be controlled collectively.

When the inverter operates, the switching elements used in the inverter and booster circuits, and a linking reactor produce heat. In order that such heat may escape efficiently, it is preferred that the material constituting the outer package of the inverter be a metal, especially aluminum or an alloy thereof.

The inverter in this embodiment is secured using a filler employed in the solar battery module. However, if the inverter is provisionally secured by adhesion or bonding with a thermal conductor interposed between the inverter and the back reinforcing material, operability when the solar battery module is fabricated will be improved.

It is preferred that the surface of the inverter package that opposes the back reinforcing material be formed to have recesses and protrusions as necessary. Since bringing the surface of the inverter package and the surface of the back reinforcing material into perfect contact is difficult in actuality, effecting this contact upon first embossing the surface of the inverter package will in effect provide greater surface area. It is preferred that the heat-radiating effect be enhanced by providing the inverter package surface with protrusions such as fins and inserting a thermal conductor between the package surface and the back reinforcing material.

The inverter preferably is fabricated so as to be as thin as possible. Producing a hybrid IC that contains a solar cell can be achieved using a thin-film inductor, as set forth in The Institute of Electrical Engineers of Japan, Technical Report (Section II), No. 449, though this involves a high degree of difficulty.

Thermal Conductor

The thermal conductor is interposed between the back reinforcing material of the solar battery module and the inverter and transmits heat evolved by the inverter to the back reinforcing material.

The thermal conductor preferably has the form of a gel, paste, grease, sheet or oil compound, though the member is not limited to these. An insulating or non-insulating material can be employed. Preferred examples of materials are metals or metal oxides such as mercury, aluminum and aluminum oxide or resins such as silicone, acrylic and epoxy resins containing an electrically conductive material. Among these materials, those exhibiting a stickiness, a thermocompression bonding property or an adhesive property can be used. In case of a material having such properties, the inverter can be secured to the back reinforcing material more strongly.

Structure of Solar Battery Module

FIG. 1 is a diagram illustrating the structure of a solar battery module 101.

As shown in FIG. 1, the solar battery module 101 includes a weather-resistant film 102, a back reinforcing material 103, fillers 104 and 105, a solar battery element 106, an inverter 107 and lead wires 108.

By stacking weather-resistant film 102, filler 104, solar battery element 106, filler 105 and the back reinforcing material 103 in the order mentioned and melting the fillers 104 and 105 at 150° C. using a vacuum laminator, the solar battery module 101, in which the solar battery element 106 is resin-sealed between the back reinforcing material 103 and weather-resistant film 102, is created.

The inverter 107 is placed on the surface of the back reinforcing material 103 that opposes the solar battery element 106 and is disposed in such a manner that the package thereof is in direct contact with the back reinforcing material 103. The latter has a hole through which the lead wires 108, which extract AC power generated by the inverter 107, are passed.

An opening for connecting the output terminals of the solar battery element 106 to the inverter 107 is provided in the filler 105 at a position corresponding to these terminals.

If the solar battery module 101 thus formed is subjected to a prescribed amount of solar radiation, DC power generated by the solar battery element 106 can be converted to AC power by the inverter 107 mounted on the back reinforcing material 103. The solar battery module 101 delivers this AC power at its output.

A solar array that outputs AC power can also be constructed by connecting a plurality of the solar battery modules 101.

Thus, the inverter 107 is fixed in the filler within the solar battery module 101. When the solar battery module 101 is transported or installed, therefore, the inverter 107 will not strike building structures and it is possible to prevent damage to the inverter 107 and a decline in the reliability thereof.

Further, when the solar battery module 101 generates power and the inverter 107 operates, heat evolved by the inverter 107 can be transferred effectively to the back reinforcing material 103 of the solar battery module 101. As a result, the heat evolved by the inverter 107 escapes efficiently and the reliability of the inverter 107 can be improved.

In a case where an amorphous silicon solar battery is used as the solar battery element 106, an improvement in conversion efficiency can be expected owing to an annealing effect brought about by a rise in the temperature of the back reinforcing material 103.

First Embodiment

Figure 2:
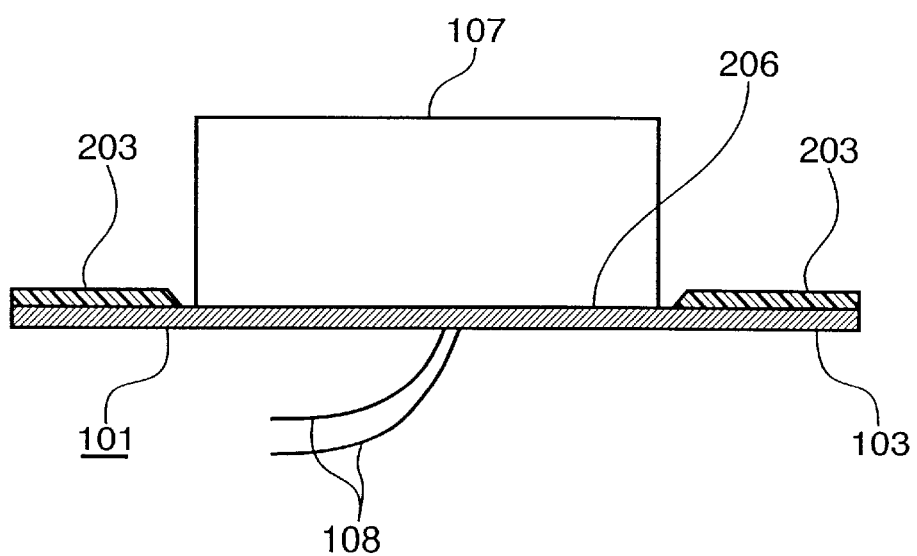
FIG. 2 is a diagram useful in describing in detail the mounting of an inverter in the solar battery module.

FIG. 2 is a diagram useful in describing in detail the mounting of the inverter 107 in the solar battery module 101 illustrated in FIG. 1.

The back reinforcing material 103 has a coating 203. Before the inverter 107 is mounted on the back reinforcing material 103, the portion of the coating 203 corresponding to an inverter mounting position 206 is removed by MEK (methyl ethyl ketone). After the coating 203 corresponding to the inverter mounting position 206 is removed, the inverter 107 is mounted on the back reinforcing material 103 and the solar battery module 101 is fabricated by carrying out the lamination process mentioned above. Of course, a thermal conducting material may be applied as necessary between the inverter 107 and back reinforcing material 103.

When the solar battery module 101 having the structure shown in FIG. 2 generates AC power, the heat produced by the inverter 107 is transferred effectively to the back reinforcing material 103 because the coating 203 on the back reinforcing material 103 beneath the inverter 107 has been removed. The heat from the 107 therefore escapes efficiently so that the reliability of the inverter 107 is enhanced.

Second Embodiment

Figure 3:
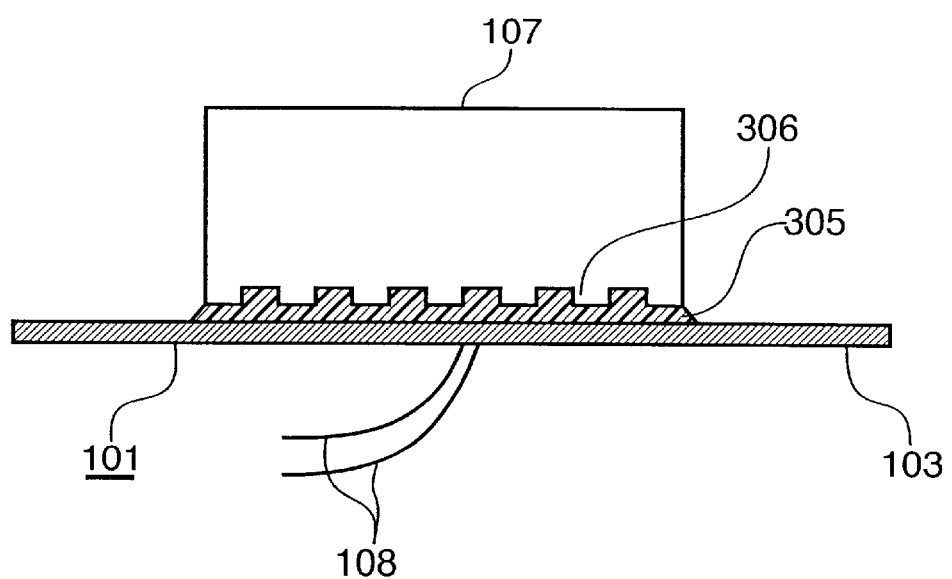
FIG. 3 is a diagram useful in describing in detail the mounting of an inverter in the solar battery module.

FIG. 3 is a diagram useful in describing in detail the mounting of the inverter 107 in the solar battery module 101 shown in FIG. 1.

The inverter 107 has fins 306 provided at a fine pitch on its bottom side, and a thermal conductor 305 is interposed between the fins 306 and the back reinforcing material 103. Mercury paste, for example, is used as the thermal conductor 305, and the fins 306 and back reinforcing material 103 are brought into intimate contact so that the heat evolved by the inverter 107 will be transferred effectively to the back reinforcing material 103.

When the solar battery module 101 having the structure shown in FIG. 3 generates AC power, the heat produced by the inverter 107 is transferred effectively to the back reinforcing material 103 because the thermal conductor 305 is interposed between the inverter 107 and the back reinforcing material 103. The heat from the 107 therefore escapes efficiently so that the reliability of the inverter 107 is enhanced.

Third Embodiment

FIG. 4 is a perspective view of the solar battery module 10, which has been worked into the shape of a roofing tile. Here the longitudinal side edges of the solar battery module 101 are bent to form upstanding portions 402.

Figure 5:
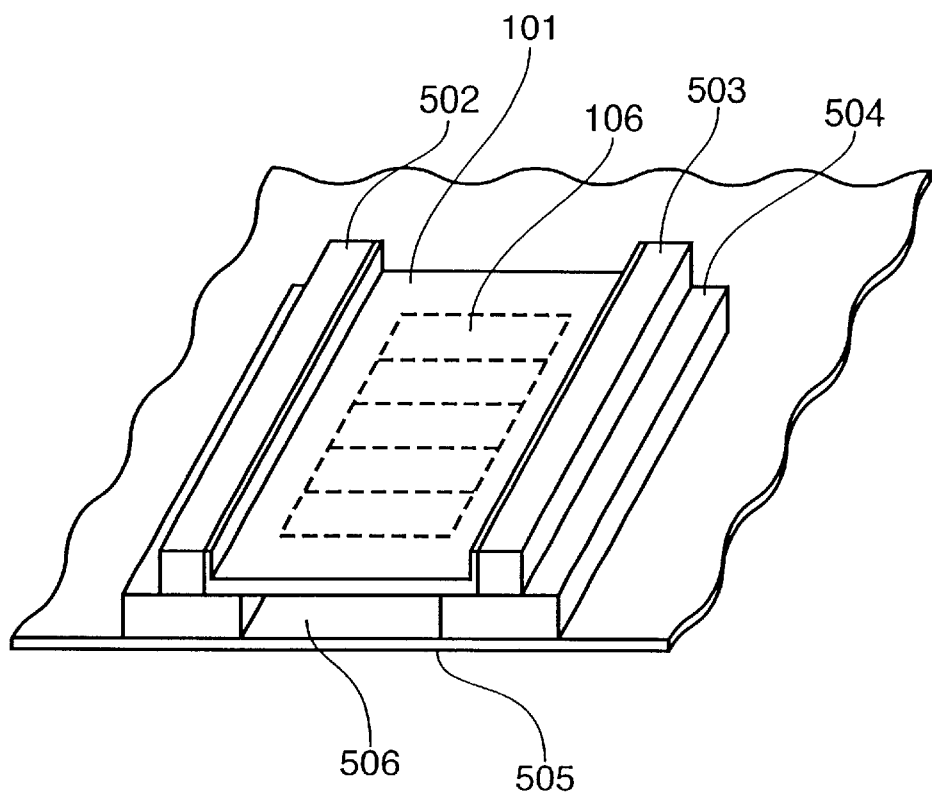
FIG. 5 is a diagram illustrating a method of installing a solar battery module in the shape of a roofing tile.

FIG. 5 is a diagram illustrating a method of installing the solar battery module 101 in the shape of a roofing tile.

As shown in FIG. 5, spacers 504 are placed at prescribed intervals on sarking 505, and centering strips 503 are placed on respective ones of the spacers 504. The solar battery module 101 is placed on step portions formed by the spacers 504 and centering strips 503, and the solar battery module 101 is fixed by driving nails into the centering strips 502.

By thus installing the solar battery module 101, an air-flow passageway 506 is formed between the sarking 505 and solar battery module 101. The air-flow passageway 506 is for utilizing air, which flows in from the direction of the ridge, upon warming the air by the heat produced by the inverter 107.

Though not shown in FIG. 5, the necessary number of solar battery modules are installed by connecting the solar battery modules 101 in the direction of the ridge.

Thus, in the third embodiment, the air between the solar battery module 101 in the shape of a roofing tile and the sarking 505 can be warmed efficiently. This embodiment is effective in heat collection that relies upon a roof.

Fourth Embodiment

Figure 6:
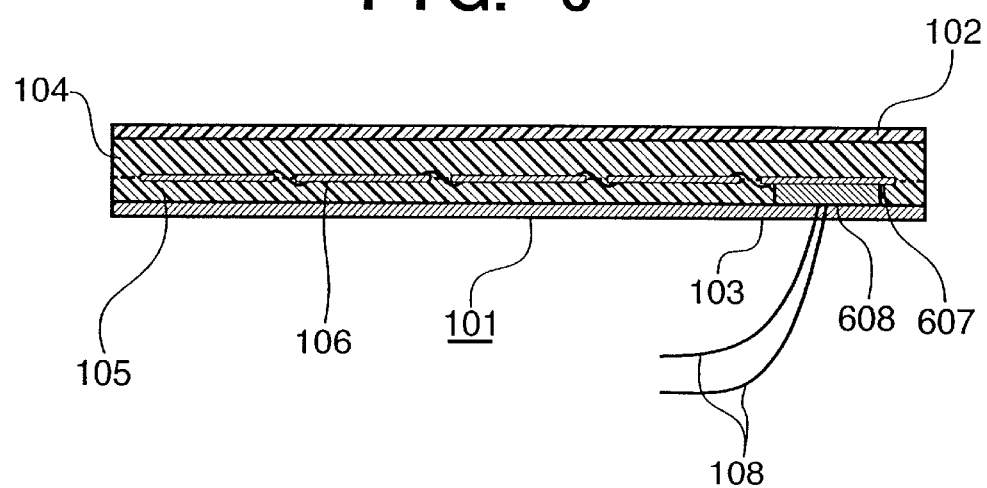
FIG. 6 is a diagram showing another structure of a solar battery module according to the present invention.

FIG. 6 is a diagram showing another structure of the solar battery module 101.

Numeral 607 denotes a hybrid device obtained by integrating a solar battery element and an inverter. More specifically, an inverter circuit is incorporated beforehand in a solar battery element by using a thin-film inductor. A heat conducting member 608 is interposed between the inverter portion of the device 607 and the back reinforcing material 103.

Thus, the inverter circuit is incorporated in the solar battery element. When the solar battery module 101 is transported or installed, therefore, the inverter 107 will not strike building structures and it is possible to prevent damage to the inverter 107 and a decline in the reliability thereof in a manner similar to that of the solar battery module 101 shown in FIG. 1.

Further, when the solar battery module 101 generates power and the inverter circuit operates, heat evolved by the inverter circuit can be transferred effectively to the back reinforcing material 103 of the solar battery module 101 via the heat conducting member 608 in a manner similar to that of the solar battery module 101 shown in FIG. 1. As a result, the heat evolved by the inverter 107 escapes efficiently and the reliability of the inverter 107 can be improved.

The effects set forth below are obtained with the embodiments described above. It goes without saying that the same effects can be expected also in a case where a DC/DC converter is used instead of an inverter.

(1) The inverter is secured within the solar battery module. As a result, the inverter will not strike building structures and it is possible to prevent damage to the inverter and a decline in the reliability thereof.

(2) Heat evolved by the inverter is transferred effectively to the back insulating material of the solar battery module. As a result, the heat evolved by the inverter escapes efficiently and the reliability of the inverter can be improved.

(3) In a case where an amorphous silicon solar battery is used as the solar battery element, the temperature of the back reinforcing material rises owing to heat produced by the inverter. As a result, an improvement in conversion efficiency owing to the annealing effect can be expected.

(4) In a case where a solar battery module in the shape of a roofing tile is utilized in a heat collecting roof, air between the solar battery module and sarking can be warmed efficiency by heat that is transferred effectively from the inverter to the back reinforcing material.

As many apparently widely different embodiments of the present invention can be made without departing from the spirit and scope thereof, it is to be understood that the invention is not limited to the specific embodiments thereof except as defined in the appended claims.

What is claimed is:

1. A solar battery device comprising:

a solar battery;

a power converter, arranged to convert power output from said solar battery, wherein said solar battery and said power converter are integrated; and a metal plate which mounts said integrated solar battery and power converter, wherein said power converter is placed at a position between said solar battery and said metal plate, and is contacted to a surface of said metal plate.

2. The device according to claim 1, wherein said power converter is fixed to said metal plate by resin.

3. A solar battery device comprising:

a solar battery:

a power converter for converting power output from said solar battery, said battery and said power converter being integrated;

a metal plate for mounting said solar battery and said power converter;

a thermal conductor placed at a position between said power converter and said metal plate; and a filler, which is different from said thermal conductor, for encapsulating said solar battery and said power converter.

4. The device according to claim 1, wherein said metal plate is a steel plate having a coating formed on a surface thereof, said coating being removed from a portion of said surface that contacts said power converter.

5. The device according to claim 1, wherein a surface of said power converter that contacts said metal plate is provided with recesses and protrusions.

6. The device according to claim 1, wherein said power converter is an inverter for converting DC power to AC power.

7. The device according to claim 1, wherein said power converter is a DC/DC converter for converting DC power to DC power having a different voltage.

8. The device according to claim 1, wherein said solar battery is an amorphous silicon solar battery.

9. A method of manufacturing a solar battery device, comprising the steps of:

stacking at least a first filler, a solar battery, a second filler and a metal plate, in the order mentioned;

placing a power converter, which converts power output from the solar battery, at a position between the solar battery and metal plate; and integrating the solar battery, the power converter and the metal plate by melting the first and second fillers to contact the power converter and the metal plate.

10. A power generator for generating power comprising the solar battery device set forth in claim 1.

11. A method of manufacturing a solar battery device, comprising the steps of:

stacking at least a metal plate, a first filler, a solar battery and a second filler in the order mentioned;

placing a power converter, which converts power output from the solar battery, at a position between the solar battery and metal plate;

placing a thermal conductor, which is different from the first and second fillers, at a position between the power converter and the metal plate; and integrating the solar battery, the power converter and the metal plate by fusing the first and second fillers.

* * * * *